United States Patent [19]
Kukkonen

[11] Patent Number: 5,764,109
[45] Date of Patent: Jun. 9, 1998

[54] VOLTAGE-CONTROLLED OSCILLATOR (VCO) HAVING A VOLTAGE DERIVED FROM ITS OUTPUT TO TUNE ITS CENTER FREQUENCY

[75] Inventor: Osmo Kukkonen, Salo, Finland

[73] Assignee: Nokia Mobile Phones Ltd., Finland

[21] Appl. No.: 669,041

[22] Filed: Jun. 24, 1996

[30] Foreign Application Priority Data

Jul. 20, 1995 [FI] Finland .................... 953498

[51] Int. Cl.[6] .................... H03B 5/00; H03L 7/00
[52] U.S. Cl. .................... 331/44; 331/177 V
[58] Field of Search .................... 331/44, 177 R, 331/177 V

[56] References Cited

U.S. PATENT DOCUMENTS

| | | | |
|---|---|---|---|
| 4,503,402 | 3/1985 | Englund, Jr. | 331/117 FE |
| 4,570,130 | 2/1986 | Grindel et al. | 331/8 |
| 4,713,631 | 12/1987 | Enderby et al. | 331/36 C |
| 4,881,048 | 11/1989 | Auneau et al. | 331/14 |
| 5,159,626 | 10/1992 | Baum et al. | 379/67 |
| 5,164,685 | 11/1992 | Niemio | 331/8 |
| 5,357,222 | 10/1994 | Hietala | 332/124 |
| 5,382,922 | 1/1995 | Gersbach et al. | 331/1 A |
| 5,446,417 | 8/1995 | Korhonen et al. | 331/57 |
| 5,486,866 | 1/1996 | Helfrich et al. | 348/500 |

*Primary Examiner*—Siegfried H. Grimm
*Attorney, Agent, or Firm*—Perman & Green, LLP

[57] ABSTRACT

The invention is related to an electrically tunable voltage-controlled oscillatory circuit, wherein the negative bias voltage (–Vcf) of a capacitance diode (5) needed for tuning the center frequency of the oscillatory circuit is generated on the basis of an electric oscillating signal (RFout) produced by the oscillatory circuit itself. Said oscillating signal is used for generating a negative voltage with a clamp/voltage multiplier type circuit (15) and it is adjusted to a desired value with an adjustment circuit (14), in which the values of the components (R2) can be permanently adjusted suitable in the tuning stage. Alternatively, the adjustment circuit (14) may include an active component (Q1) which can have an effect on the value of the negative bias voltage (–Vcf) during the use of the oscillatory circuit.

22 Claims, 2 Drawing Sheets

VOLTAGE-CONTROLLED OSCILLATOR (VCO) HAVING A VOLTAGE DERIVED FROM ITS OUTPUT TO TUNE ITS CENTER FREQUENCY

FIELD OF THE INVENTION

The present invention relates generally to voltage-controlled oscillatory circuits, or oscillators, and particularly to the electric tuning of their center frequencies to predetermined values.

BACKGROUND OF THE INVENTION

Voltage-controlled oscillatory circuits, or oscillators, the oscillating frequency of which can be adjusted with a voltage signal, are commonly used components in devices utilizing radio technology. In the vocabulary of the art they are usually referred to as VCOs, and we will use that abbreviation in the description that follows. A VCO circuit typically comprises a control voltage input and a high-frequency output, and the value of the control voltage, ie. the voltage signal brought to said input, controls the frequency of the high-frequency signal obtained from said output in such a way that with a low control voltage a certain minimum frequency is obtained from the output, and with a high control voltage a certain maximum frequency is obtained. The range between the extremes is here called the frequency band of the VCO and the value in the middle of that range is called the center frequency.

Typically, the user of a radio device or, in cellular systems, the network automatically can set the radio device to operate at a certain frequency. When designing a radio device for a particular radio communication system, the VCO is preferably designed such that its center frequency is substantially in the middle of the frequency band of the radio communication system in question, whereby a certain frequency either in the lower part or in the upper part of the VCO frequency band can be chosen as the operating frequency by means of the control voltage. However, variation in the component characteristics results in that the center frequency of a VCO coming from the production line not being identical with the desired frequency, and therefore there must be a way to tune the center frequency of a finished VCO to the desired value.

A conventional method has been so-called mechanical tuning, wherein a resonator element, such as a strip conductor grounded at regular intervals, has been included in the VCO's oscillatory circuit in the manufacturing stage, and the frequency characteristics of the strip conductor have been altered in the tuning stage e.g. by cutting off some of the ground connections. However, this method has been found so inaccurate and inconvenient that, lately, so-called electric tuning has become more and more popular. Electric tuning means that in addition to said control voltage another voltage signal is brought to the VCO, and that other signal is set to a desired value in the tuning stage and that value is not changed thereafter. This voltage will hereinafter be called the tuning voltage.

FIGS. 1a and 1b show a block diagram of an electrically tunable VCO representing the prior art. It includes a resonator part 1, typically an LC circuit, and an amplifier 2, and a feedback part 3 in parallel with the amplifier for realizing favourable oscillating conditions. Typically, the circuit also includes a buffer amplifier 4 which separates the rest of the parts of the circuit from the high-frequency output 11. The component that actually has an effect on the oscillating frequency of the resonator part 1 is the varactor, or capacitance diode 5 connected to it, the capacitance of which depends on the voltage across it, ie. the bias voltage. Said voltage is generated by bringing a control voltage Vcrl to the cathode of the capacitance diode 5 via the control voltage input 9 and a series resistor 8, and a tuning voltage −Vcf to its anode via the tuning voltage input 10 and a series resistor 7. Generating a voltage across a diode is generally called biasing the diode and thus we can say that the capacitance diode 5 is biased by means of the control voltage Vcrl and tuning voltage −Vcf. Typically, the circuit also includes a capacitor 6 between the anode of the capacitance diode 5 and the ground potential to prevent the flow of direct current.

In the arrangement according to FIG. 1a, the tuning voltage −Vcf is typically negative relative to the ground potential because the control voltage Vcrl may vary, for example, in the range from 0 to +5 V, and it must always be positive relative to the tuning voltage. In conventional electric tuning, the tuning voltage −Vcf assumes a certain value with which the center frequency of the VCO gets the desired value, and its value is not changed thereafter. It is known from U.S. Pat. No. 4,713,631 an arrangement according to FIG. 1b which is otherwise identical with the one shown in FIG. 1a, except that it further includes a voltage division means 12 and selection means 13 to select the value of the tuning voltage −Vcf from a certain group of preset values during the operation of the radio device. That arrangement is aimed at extending the useful frequency range of the VCO.

However, the arrangement according to the prior art depicted in FIG. 1a, which forms the basis of the variation disclosed in said U.S. Patent, has the disadvantage that the tuning voltage −Vcf has to be generated elsewhere in the radio device. Because it is typically a negative voltage, the generation of this voltage usually requires the use of another oscillator included in the radio device, in addition to "extra" connections from said other oscillator to the VCO, which loads the oscillator in question and increases production costs. Furthermore, factors affecting the operation of said other oscillator, such as temperature and other drift, are reflected in the operation of the VCO.

SUMMARY OF THE INVENTION

An object of this invention is to provide an electrically tunable voltage-controlled oscillatory circuit the tuning of which utilizes the circuit's own characteristics. Another object of the invention is to provide an electrically tunable voltage-controlled oscillatory circuit the tuning of which can be electrically changed during operation. A further object of the invention is to avoid the above-mentioned disadvantages related to VCO circuits according to the prior art. A yet further object of the invention is to realize temperature compensation against frequency drift in the VCO.

The objects of the invention are achieved with an arrangement in which the signal needed for electric tuning is generated by a circuit arrangement based on oscillations produced by the VCO itself. It is advantageous for the achievement of the objects of the invention that said coupling arrangement includes a part which can be permanently tuned using a known method suitable for mass production. It is also advantageous for the achievement of the objects of the invention that said arrangement includes a part that can be controlled by an electric signal to change the level of the tuning voltage during operation.

The oscillatory circuit according to the invention produces an electric oscillating signal, comprises a means for tuning its center frequency with an electric signal, and is characterized in that it comprises a means for generating said electric signal on the basis of said electric oscillating signal.

The invention is also directed to a method for tuning the center frequency of a voltage-controlled oscillatory circuit, which produces the electric oscillating signal and which includes a capacitance diode. The method according to the invention is characterized in that a voltage is generated on the basis of said oscillating signal and that the voltage is taken to said capacitance diode for biasing.

The invention is based on the novel idea that oscillations generated by the VCO itself can be used to generate a negative voltage that can be used as a tuning voltage. The circuit that produces the negative tuning voltage may be equipped with a component the value of which can be accurately set during the production and/or tuning stage, whereby the tuning voltage value can be set as desired in order to tune the center frequency of the VCO. The circuit producing the tuning voltage may also be equipped with an active component the value of which can be changed e.g. with a voltage signal, whereby the value of the component has an effect during operation on the tuning voltage and, hence, on the center frequency of the VCO. The tuning method according to the invention radically reduces the dependence of the electrically tunable VCO on an external precision voltage to achieve a suitable tuning state.

BRIEF DESCRIPTION OF THE DRAWINGS

Below, the invention is described in greater detail through preferred embodiments referring to the accompanying drawing, in which.

DETAILED DESCRIPTION OF THE INVENTION

Figure 1A:
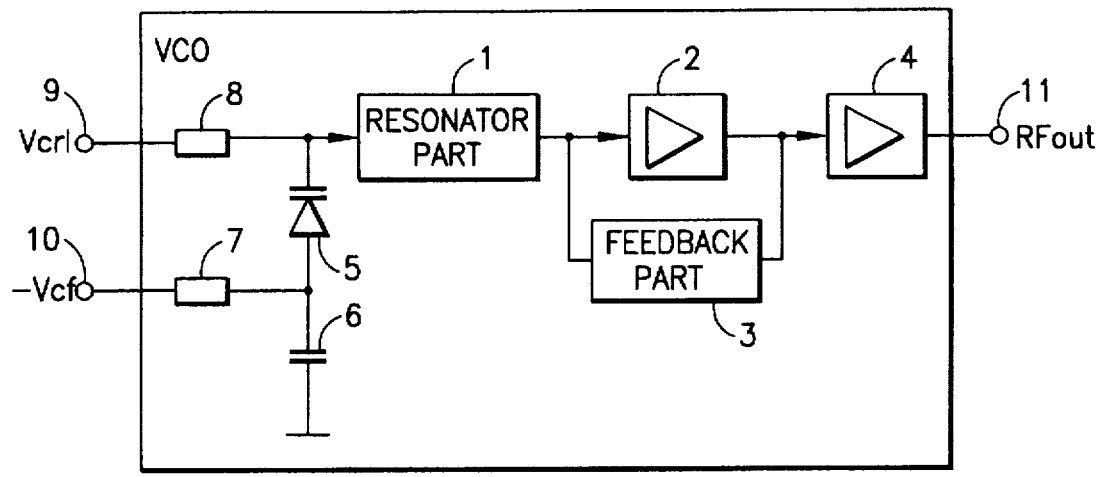
FIG. 1a is a block diagram of an electrically tunable voltage-controlled oscillatory circuit according to the prior art.
Figure 1B:
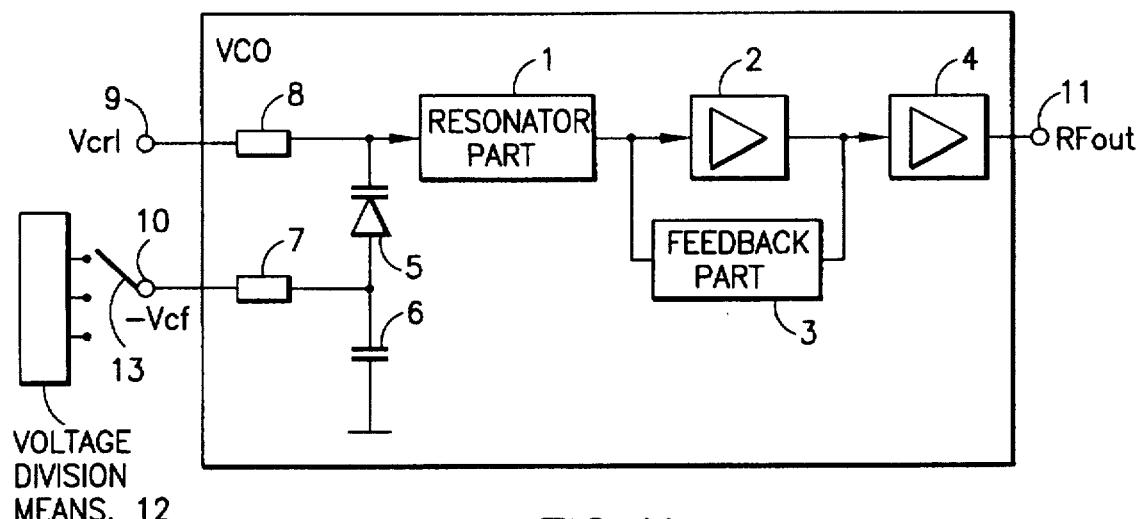
FIG. 1b is a known variation of the circuit according to FIG. 1a, FIG. 2 is a block diagram of an electrically tunable voltage-controlled oscillatory circuit according to the invention.

Like elements are denoted by like reference numbers in the drawing. Since FIGS. 1a and 1b were explained above in connection with the discussion on the prior art, references will be made mainly to FIGS. 2 to 5 in the following description.

Figure 2:
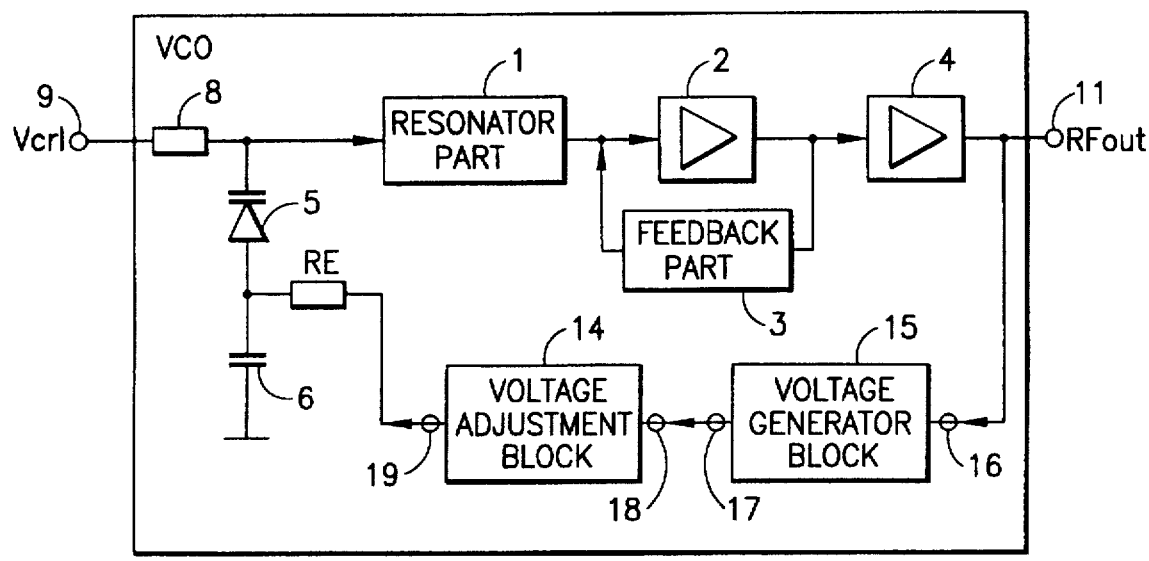

An embodiment of the invention illustrated by FIG. 2 comprises a resonator part 1, an amplifier 2 and its feedback part 3 and a buffer amplifier 4 coupled in the same way as in the prior art VCO discussed above. The VCO according to the invention also includes a capacitance diode 5 and a capacitor 6, and a control voltage Vcrl is connected to the cathode of the capacitance diode 5 via a control voltage port 9 and a series resistor 8. The inventive idea described below is in no way limited to the embodiment depicted here but the components according to the prior art and their coupling arrangements are depicted only as an example of an advantageous implementation of a typical VCO. A person skilled in the art will appreciate that the same inventive idea is applicable to other known VCO circuits that utilize tuning by an electric signal.

The VCO circuit according to the invention, shown in FIG. 2, differs from the prior art in that it does not have a tuning voltage input, but the tuning voltage is generated in the VCO circuit itself. FIG. 2 shows a negative voltage generation block 15 and a voltage level adjustment block 14, which together produce the tuning voltage −Vcf. In the embodiment illustrated in FIG. 2, the input of the negative voltage generation block 15 is connected to the output of a buffer amplifier 4 so that said buffer amplifier separates the parts required for producing the tuning voltage from the amplifier 2 and feedback part 3. In the coupling according to FIG. 2, the input of the negative voltage generation block 15 could also be connected to the output of the amplifier 2, and, generally, in the VCO according to the invention, it can be connected to any point that produces the oscillating signal needed to generate the negative voltage without excessively interfering with the primary function of the VCO, ie. the generation of controlled oscillation to the high-frequency output 11.

The negative voltage generation block 15 coupled according to the invention generates, as its name implies, a negative voltage from the oscillating signal brought to its input, which is taken to the voltage level adjustment block 14. An advantageous implementation of the negative voltage generation block 15 comprises e.g. a known clamp and voltage multiplier circuit (not shown in FIG. 2) which will be described in more detail later in this document. The actual tuning of the VCO center frequency is performed through measures affecting the operation of the voltage level adjustment block 14. The function of block 14 is to adjust the voltage generated in block 15 to a value such that when taken to the capacitance diode 5 it produces across the diode the correct bias voltage together with the control voltage Vcrl. In the embodiment shown in FIG. 2, the voltage adjusted by block 14 is taken to the anode of the capacitance diode 5 via a series resistor RE. The input and output ports 16, 17, 18, 19 of blocks 14 and 15 have reference numbers to clarify the relationship of the detailed descriptions below with the block diagram in FIG. 2.

If the VCO in question is a VCO the final tuning of which takes place in the manufacturing stage, the voltage adjustment block 14 includes a component, advantageously an adjustable resistor, the value of which is set suitable in the tuning. If it is desirable that the tuning can be altered during operation, the voltage adjustment block 14 should include an active component, advantageously a field-effect transistor, to which it is brought an external signal to alter the operation of block 14 and, hence, the adjusted value of the tuning voltage.

The negative voltage generation block 15 and the voltage level adjustment block 14 are implemented using known technology and their details as such are inessential for the invention as far as the blocks realize the functions according to the present inventive idea. Since, however, the operation of blocks 15 and 14 is a significant part of the invention, we will below describe in detail some advantageous ways to implement those blocks, referring to FIGS. 3 to 5.

Figure 3:
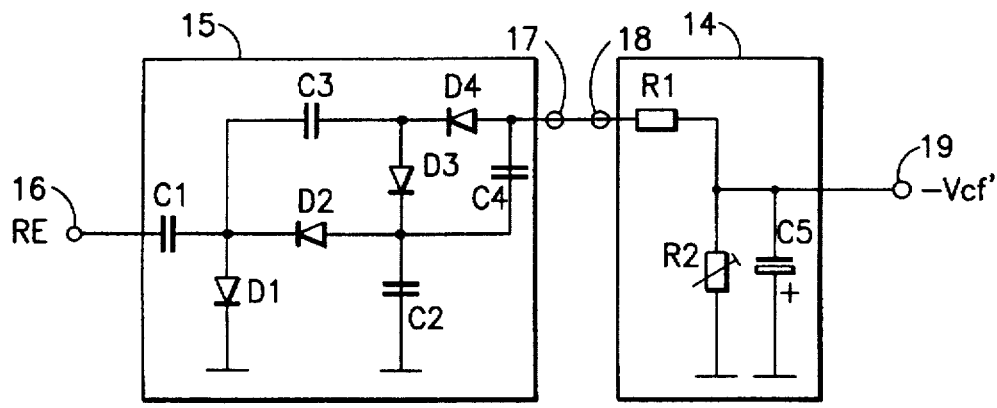
FIG. 3 shows in detail advantageous implementations of two blocks depicted in FIG. 2.

FIG. 3 shows a circuit comprising a negative voltage generation block 15 and a voltage level adjustment block 14. The blocks and the signal path through them are shown as mirror images as compared to the block diagram in FIG. 2 in order for the circuit diagram in FIG. 3 to comply to the general recommendation for signal flow in circuit diagrams.

The negative voltage generation block 15 comprises diodes D1, D2, D3 and D4 and capacitors C1, C2, C3 and C4 which constitute a known clamp-voltage multiplier type coupling. A high-frequency signal is brought to the input 16 of block 15 and a negative voltage is obtained at its output 17. Diodes D1 to D4 must have a low P/N junction capacitance and low threshold voltage; suitable diodes are BAT62 diodes, for example. As is obvious to one skilled in the art, the rating of capacitors C1 to C4 depends on the frequency used. During the development work that lead to this invention it was discovered that with the circuit depicted in FIG. 3 a +3 dBm oscillation signal produces a voltage of −3V, approximately. If it is desired to produce a voltage with a higher absolute value, an even number of diodes and capacitors can be added in a known manner to the embodiment shown in FIG. 3 using the same regular coupling order as in the figure.

The voltage level adjustment block 14 shown in FIG. 3 is implemented with a simple continuous voltage adjustment circuit based on resistances, comprising resistors R1 and R2. In addition, the coupling includes a capacitor C5 for filtering noise and interferences. The voltage to be adjusted is taken to the input 18 of the block and the adjusted voltage is obtained from the output 19. For tuning, at least one of the resistors R1, R2 must have an adjustable resistance. As far as automating the production process is concerned, an advantageous solution is e.g. that the resistance of the second resistor R2 is adjusted with a known laser tuning method.

Figures 4, 5:
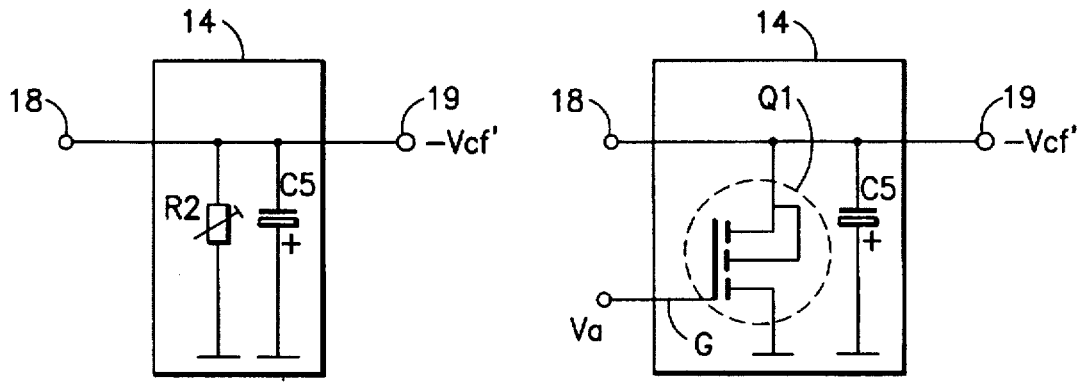
FIG. 4 shows in detail a second advantageous implementation of a block depicted in FIG. 2.
FIG. 5 shows in detail a third advantageous implementation of a block depicted in FIG. 2.

FIG. 4 shows an even simpler implementation of the voltage level adjustment block 14, wherein there is no resistor R1 and the voltage is adjusted solely by setting the resistance of the adjustable resistor R2 suitable using, for example, the aforementioned laser tuning method in conjunction with the automatic production process. The voltage to be adjusted is taken to the input 18 of the block and the adjusted voltage is obtained from the output 19.

In certain applications it is advantageous that the tuning of the VCO may be electrically altered also during operation. Then an advantageous implementation according to the invention includes in the voltage level adjustment block 14 an active component, such as a field-effect transistor Q1 according to FIG. 5. The transistor in FIG. 5 is a so-called symmetric N-channel enhancement type field-effect transistor the resistance of which can be adjusted with a positive voltage Va brought to its gate G. So, even though an external voltage signal is needed in this embodiment, it is a positive DC voltage which is easier to generate than a negative tuning voltage brought the VCO from outside according to the prior art. A suitable component is e.g. a BSS83-type transistor. The active component Q1 according; to FIG. 5 replaces the adjustable resistor R2 shown in FIG. 4, and by altering its resistance one can alter, in accordance with the function of block 14, the value of the tuning voltage −Vcf and, hence, the center frequency of the VCO according to the invention.

As far as the inventive idea disclosed here is concerned, it is not essential that the negative voltage generation block 15 and the voltage level adjustment block 14 are clearly separate blocks having only one signal path between them as shown in FIGS. 2 to 5. The idea of the invention concerning the production of the tuning voltage on the basis of the VCO's characteristics may be implemented using a hybrid block realized with known technology, wherein the generation of the tuning voltage and the voltage level adjustment are interleaved by placing the respective components suitably in a combined structure.

When implementing the tuning of the VCO center frequency according to the invention, without an external tuning voltage source, the circuit technology used can be significantly simpler. At the same time it is obtained compensation against the center frequency drift of the VCO caused by temperature changes, since in the implementation according to the invention the temperature coefficients of the control voltage Vcrl and the tuning voltage Vcf generated on the basis of the VCO operation have opposite signs. The coupling according to the invention is simple to implement e.g. in conjunction with an integrated circuit. It can be applied in all radio devices that utilize voltage-controlled oscillation circuits. A particularly advantageous application is the use of the coupling in a mobile phone.

I claim:

1. A tunable voltage-controlled oscillatory (VCO) circuit which produces an electric oscillating signal during operation, and which comprises a means (5) for tuning a center frequency of the tunable VCO circuit based on an electric signal, characterized in that it comprises means (14, 15, RE) for continuously generating, during the operation of said tunable VCO circuit, said electric signal internally within said tunable VCO circuit, on the basis of said electric oscillating signal.

2. The tunable VCO circuit of claim 1, characterized in that said tuning means comprises a capacitance diode (5) and wherein said generating means (14, 15, RE) is for producing a voltage across said capacitance diode on the basis of the electric oscillating signal in order to tune said center frequency.

3. The tunable VCO circuit of claim 2, characterized in that said generating means comprises a means (15) for generating a first voltage (−Vcf) on the basis of said electric oscillating signal and a means (14, RE) for directing said first voltage (−Vcf) to said capacitance diode (5) for biasing.

4. The tunable VCO circuit of claim 3, characterized in that it further includes an input port for applying a second, control voltage (Vcrl) thereto, said second voltage (Vcrl) for controlling said center frequency, and wherein said first voltage (−Vcf) has an opposite polarity from that of said second voltage (Vcrl).

5. A tunable voltage-controlled oscillatory (VCO) circuit which produces an electric oscillating signal, and which comprises a means (5) for tuning its center frequency using an electric signal, characterized in that it comprises means (14, 15, RE) for generating said electric signal on the basis of said electric oscillating signal, said tuning means comprising a capacitance diode (5), wherein said generating means (14, 15, RE) is for changing the voltage across said capacitance diode on the basis of the operation of said tunable voltage-controlled oscillatory circuit in order to tune said center frequency, said generating means comprising a means (15) for generating a first voltage (−Vcf) on the basis of said electric oscillating signal and a means (14, RE) for directing said first voltage (−Vcf) to said capacitance diode (5) for biasing, said first voltage generating means comprising a clamp/voltage multiplier circuit (15; D1 to D4; C1 to C4) for generating said first voltage (−Vcf) on the basis of said electric oscillating signal, and wherein said directing means includes a voltage level adjustment circuit (14; R1, R2, C5) for adjusting the value of said first voltage (−Vcf).

6. The tunable VCO circuit of claim 1, characterized in that said generating means includes an electrical component having an inherent electrical characteristic, wherein said electrical component is pre-adjusted so that said electrical characteristic has a predetermined value for causing the center frequency of said tunable VCO circuit to be tuned to a predetermined frequency.

7. The tunable VCO circuit of claim 6, characterized in that said electrical component includes a resistor (R2), and wherein said inherent electrical characteristic includes a resistance of said resistor.

8. The tunable VCO circuit of claim 1, characterized in that said generating means includes an adjustable, active electrical component having an inherent electrical characteristic, wherein a value of said inherent electrical characteristic is variable by adjustment of said adjustable, active electrical component for causing the center frequency of said tunable VCO circuit to be tuned to a desired frequency.

9. A tunable voltage-controlled oscillatory (VCO) circuit which produces an electric oscillating signal, and which comprises a means (5) for tuning its center frequency using an electric signal, characterized in that it comprises means (14, 15, RE) for generating said electric signal on the basis of said electric oscillating signal, said generating means comprising a second part (Q1) the electric characteristics of which can be repeatedly adjusted in connection with the use of said tunable voltage-controlled oscillatory circuit for the purpose of tuning the center frequency of said tunable voltage-controlled oscillatory circuit, wherein said second part includes a field-effect transistor (Q1), and wherein the adjustment of said electrical characteristics changes a gate voltage of said second part.

10. A method for tuning a center frequency of a voltage-controlled oscillator (VCO) device, the VCO device including an input port and a capacitance diode having a first terminal coupled to the input port, the method comprising the steps of:

applying a control voltage to the input port of the VCO device to cause the VCO device to output a signal of a particular frequency; and tuning the center frequency of the VCO device by continuously generating, during the operation of the VCO device, a tuning signal internally within the VCO device, on the basis of the signal output by the VCO device, and providing the tuning signal to a second terminal of the capacitance diode for biasing the capacitance diode.

11. A method as set forth in claim 10, wherein the step of generating includes the steps of:

generating a signal voltage in response to the signal output by the VCO device, the signal voltage having an opposite polarity from that of a voltage of the signal output by the VCO device; and applying the signal voltage to a voltage level adjustment means that is pre-adjusted for setting the level of the signal voltage, and, in response to applying the signal voltage to the voltage level adjustment means, providing the tuning signal from the voltage level adjustment means to the capacitance diode for biasing the capacitance diode and tuning the center frequency of the VCO device.

12. A method as set forth in claim 10, wherein the step of generating includes the steps of:

generating a signal voltage in response to the signal output by the VCO device, the signal voltage having an opposite polarity from that of a voltage of the signal output by the VCO device; and applying the signal voltage to a voltage level adjustment means, said voltage level adjustment means being adjustable for varying the level of the signal voltage;

adjusting the voltage level adjustment means so as to vary the level of the signal voltage by a selected amount, and outputting the tuning signal from the voltage level adjustment means to the capacitance diode for biasing the capacitance diode and tuning the center frequency of the VCO device.

13. A tunable, two-port voltage-controlled oscillator (VCO) device, comprising:

an input port;

an output port;

resonating means coupled between said input port and said output port;

a first amplifier interposed between an output of said resonating means and said output port;

a first, inner, negative feedback loop portion, said first negative feedback loop portion having a first end coupled to an input of said first amplifier and a second end coupled to an output of said first amplifier; and a second, outer, negative feedback loop portion, said second negative feedback loop portion having a first end coupled to an input of said resonating means and a second end coupled to said output port;

wherein, during the operation of said VCO device, said VCO device provides an output signal in response to a control voltage being applied to said input port, said output signal having a frequency that is a function of said control voltage, and wherein, during the operation of said VCO device, said second negative feedback loop continuously generates, internally within said VCO device, a tuning signal based on said output signal, said tuning signal for controlling the tuning of a center frequency of said VCO device.

14. A tunable, two-port voltage-controlled oscillator (VCO) device as set forth in claim 13, and further comprising a second amplifier interposed between said first amplifier and said output port.

15. A tunable, two-port voltage-controlled oscillator (VCO) device as set forth in claim 13, wherein the second negative feedback loop portion includes:

voltage generating means, having an input coupled to said output port, said voltage generating means for generating, in response to said output signal, a voltage having an opposite polarity from that of a voltage of said output signal;

voltage level adjustment means, said voltage level adjustment means having an input coupled to an output of said voltage generating means, said voltage level adjustment means for controlling the level of said voltage output by said voltage generating means for tuning said center frequency of said VCO device; and a varactor, said varactor being coupled between an output of said voltage level adjustment means and said input of said resonating means.

16. A tunable, two-port voltage-controlled oscillator (VCO) device as set forth in claim 15, wherein said voltage level adjustment means is pre-adjusted so as to set said voltage output by said voltage generating means to a predetermined level for tuning said center frequency of said VCO device.

17. A tunable, two-port voltage-controlled oscillator (VCO) device as set forth in claim 15, and further comprising:

a first resistor coupled between said input port and said input of said resonating means;

a second resistor coupled between said voltage level adjustment means and said varactor; and a capacitor, said capacitor having a first terminal coupled to an input terminal of said varactor and a second terminal coupled to ground.

18. A tunable, two-port voltage-controlled oscillator (VCO) device as set forth in claim 15, wherein said voltage level adjustment means includes:
   a first, input port;
   a second, output port;
   a first diode coupled between said first and second ports;
   a first plurality of capacitors coupled between said first port and said first diode;
   a second plurality of capacitors coupled between said second port and ground;
   a second diode, said second diode being coupled between a first terminal of said first diode and a terminal of a first one of said second plurality of capacitors;
   a third diode, said third diode being coupled between a first terminal of said second diode and a terminal of a first one of said first plurality of capacitors; and
   a fourth diode, said fourth diode being coupled between said terminal of said first one of said first plurality of capacitors and ground.

19. A tunable, two-port voltage-controlled oscillator (VCO) device as set forth in claim 15, wherein said voltage generating means includes:
   a first, input port;
   a second, output port;
   a first resistor coupled between said first and second ports;
   a second, variable resistor coupled between said second port and ground; and
   a capacitor coupled between said second port and ground.

20. A tunable, two-port voltage-controlled oscillator (VCO) device as set forth in claim 15, wherein said voltage generating means includes:
   a first, input port;
   a second, output port;
   a variable resistor, said variable resistor having a first terminal coupled to said second port and a second terminal coupled to ground; and
   a capacitor, said capacitor having a first terminal coupled to said second port and a second terminal coupled to ground.

21. A tunable, two-port voltage-controlled oscillator (VCO) device as set forth in claim 15, wherein said voltage generating means includes:
   a first, input port;
   a second, output port;
   a lead coupled between said first and second ports;
   a field-effect transistor (FET), said FET having a first terminal coupled in said lead, a second terminal coupled to ground, and a third, input terminal coupled to an input voltage; and
   a capacitor, said capacitor having a first terminal coupled in said lead and a second terminal coupled to ground.

22. A tunable, two-port voltage-controlled oscillator (VCO) device as set forth in claim 13, wherein said tunable, two-port voltage-controlled oscillator (VCO) device is a component part of a radiotelephone.

* * * * *